United States Patent
Konno et al.

(10) Patent No.: US 8,729,517 B2
(45) Date of Patent: May 20, 2014

(54) NONVOLATILE SEMICONDUCTOR MEMORY DEVICE AND METHOD FOR MANUFACTURING NONVOLATILE SEMICONDUCTOR MEMORY DEVICE

(75) Inventors: Takuya Konno, Kanagawa-ken (JP); Kazuhiko Yamamoto, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 421 days.

(21) Appl. No.: 13/044,951

(22) Filed: Mar. 10, 2011

(65) Prior Publication Data

US 2011/0309318 A1    Dec. 22, 2011

(30) Foreign Application Priority Data

Jun. 16, 2010  (JP) .................... 2010-136898

(51) Int. Cl.
*H01L 45/00*   (2006.01)
(52) U.S. Cl.
CPC .......... *H01L 45/141* (2013.01); *H01L 45/1608* (2013.01)
USPC ........................... 257/2; 257/3; 257/4; 257/5
(58) Field of Classification Search
CPC .................... H01L 45/141; H01L 45/1608
USPC .......................................... 257/2, 3, 4, 5, 7, 8
See application file for complete search history.

(56) References Cited

U.S. PATENT DOCUMENTS

| | | | |
|---|---|---|---|
| 7,504,051 | B2 | 3/2009 | Sen et al. |
| 2010/0072445 | A1 | 3/2010 | Schricker et al. |
| 2011/0049463 | A1 | 3/2011 | Yamamoto et al. |
| 2011/0183489 | A1* | 7/2011 | Ghenciu et al. ............... 438/382 |
| 2011/0266513 | A1* | 11/2011 | Williams et al. .................. 257/4 |
| 2011/0305064 | A1* | 12/2011 | Jo et al. ......................... 365/148 |
| 2013/0051121 | A1* | 2/2013 | Yang et al. ..................... 365/148 |

FOREIGN PATENT DOCUMENTS

JP    2008-166591 A    7/2008

OTHER PUBLICATIONS

U.S. Appl. No. 12/973,064, filed Dec. 20, 2010, Kenji Aoyama et al.
U.S. Appl. No. 12/956,548, filed Nov. 30, 2010, Kazuhiko Yamamoto et al.

* cited by examiner

*Primary Examiner* — Phat X Cao
(74) *Attorney, Agent, or Firm* — Oblon, Spivak, McClelland, Maier & Neustadt, L.L.P.

(57) ABSTRACT

According to one embodiment, a nonvolatile semiconductor memory device includes a first interconnect, a second interconnect and a resistance change layer. The first interconnect extends in a first direction on a major surface of a substrate. The second interconnect extends in a second direction non-parallel to the first direction. The resistance change layer includes a conductive nanomaterial, the resistance change layer located between the first interconnect and the second interconnect and being capable of reversibly changing between a first resistance state and a second resistance state by a voltage applied or a current supplied through the first interconnect and the second interconnect. The resistance change layer has a density varied along a third direction generally perpendicular to the first direction and the second direction.

11 Claims, 8 Drawing Sheets

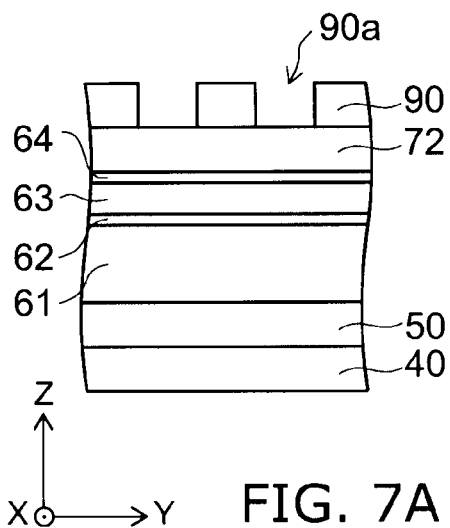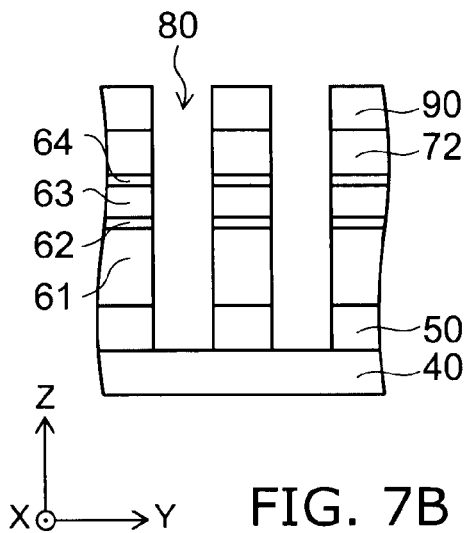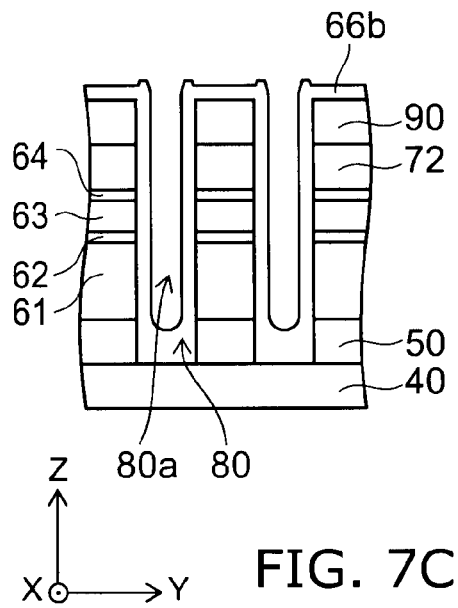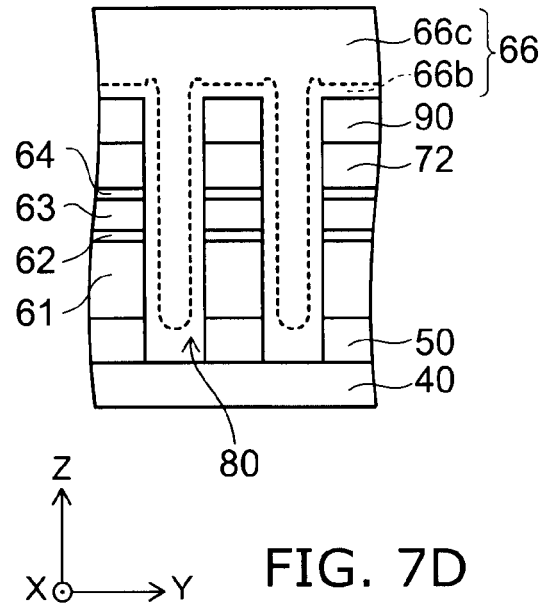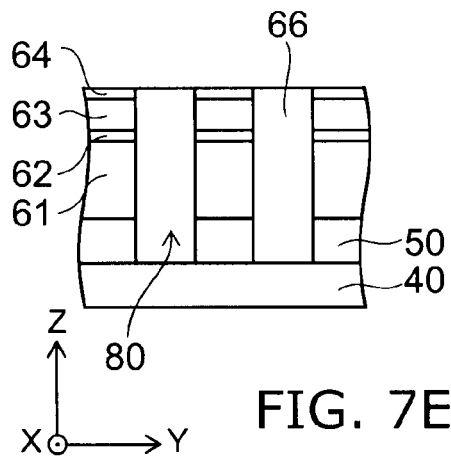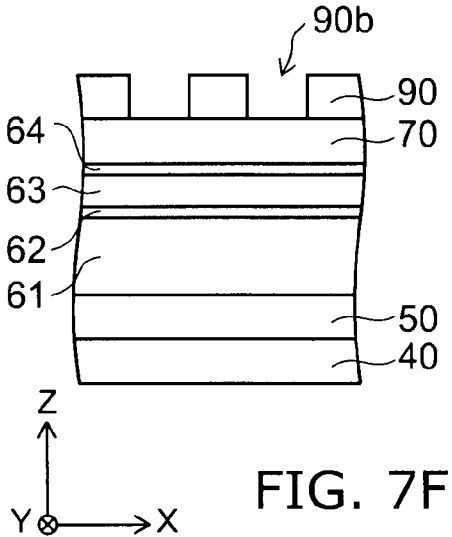

NONVOLATILE SEMICONDUCTOR MEMORY DEVICE AND METHOD FOR MANUFACTURING NONVOLATILE SEMICONDUCTOR MEMORY DEVICE

CROSS-REFERENCE TO RELATED APPLICATIONS

This application is based upon and claims the benefit of priority from the prior Japanese Patent Application No. 2010-136898, filed on Jun. 16, 2010; the entire contents of which are incorporated herein by reference.

FIELD

Embodiments described herein relate generally to a nonvolatile semiconductor memory device and a method for manufacturing the nonvolatile semiconductor memory device.

BACKGROUND

As the material of resistance change elements (resistance change layers) provided in a nonvolatile semiconductor memory device (ReRAM, resistance change memory), carbon-based nanomaterials (hereinafter simply referred to as carbon nanomaterials) such as carbon nanotubes and fullerenes are under study.

Here, the resistance change layer including a carbon nanomaterial has interstices in its structure. Thus, when electrodes are formed so as to sandwich the resistance change layer, the interstices of the resistance change layer may be filled with a conductor substance, which may cause short circuit between the electrodes. The following problem arises in this case. If short circuit occurs between the electrodes sandwiching the resistance change layer, no voltage can be applied to the resistance change layer, and no resistance change can be produced.

Furthermore, with the decrease of film thickness of the resistance change layer, the distance between the electrodes is made shorter, and short circuit is more likely to occur. This makes it difficult to reduce the thickness of the resistance change layer and increase the integration density of the nonvolatile semiconductor memory device. Furthermore, interstices occur between carbon nanomaterials, and hence decrease the contact area between the resistance change layer and the electrode. Thus, the adhesiveness therebetween is made insufficient, which may increase the danger of peeling. In addition, the decreased contact area between the resistance change layer and the electrode may increase the contact resistance.

BRIEF DESCRIPTION OF THE DRAWINGS

FIGS. 7A to 7F are schematic process sectional views illustrating a method for manufacturing the nonvolatile semiconductor memory device;

DETAILED DESCRIPTION

Figure 1:
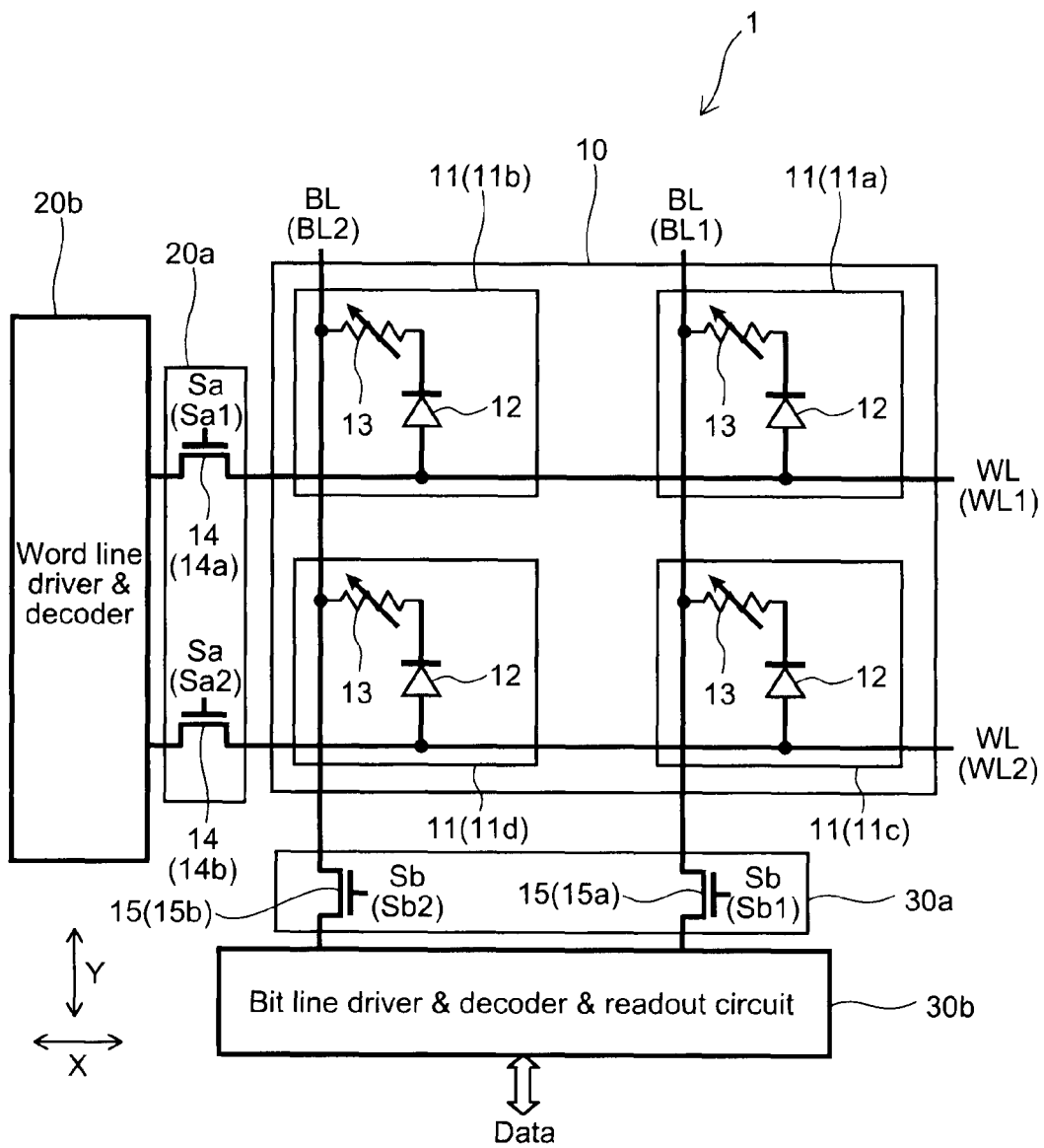
FIG. 1 is a schematic circuit diagram illustrating a nonvolatile semiconductor memory device according to an embodiment.

In general, according to one embodiment, a nonvolatile semiconductor memory device includes a first interconnect, a second interconnect and a resistance change layer. The first interconnect extends in a first direction on a major surface of a substrate. The second interconnect extends in a second direction non-parallel to the first direction. The resistance change layer includes a conductive nanomaterial, the resistance change layer located between the first interconnect and the second interconnect and being capable of reversibly changing between a first resistance state and a second resistance state by a voltage applied or a current supplied through the first interconnect and the second interconnect. The resistance change layer has a density varied along a third direction generally perpendicular to the first direction and the second direction.

In general, according to another embodiment, a method is disclosed for manufacturing a nonvolatile semiconductor memory device. The nonvolatile semiconductor memory device includes a first interconnect extending in a first direction on a major surface of a substrate, a second interconnect extending in a second direction non-parallel to the first direction, and a resistance change layer including a conductive nanomaterial, the resistance change layer located between the first interconnect and the second interconnect and being capable of reversibly changing between a first resistance state and a second resistance state by a voltage applied or a current supplied through the first interconnect and the second interconnect. The method includes forming the resistance change layer. Density is varied along a third direction generally perpendicular to the first direction and the second direction in the forming the resistance change layer.

Various embodiments will be described hereinafter with reference to the accompanying drawings. In the figures, similar components are labeled with like reference numerals, and the detailed description thereof is omitted as appropriate. The arrows X, Y, Z in the figures represent mutually orthogonal directions.

FIG. 1 is a schematic circuit diagram illustrating a nonvolatile semiconductor memory device 1 according to an embodiment.

Figure 2:
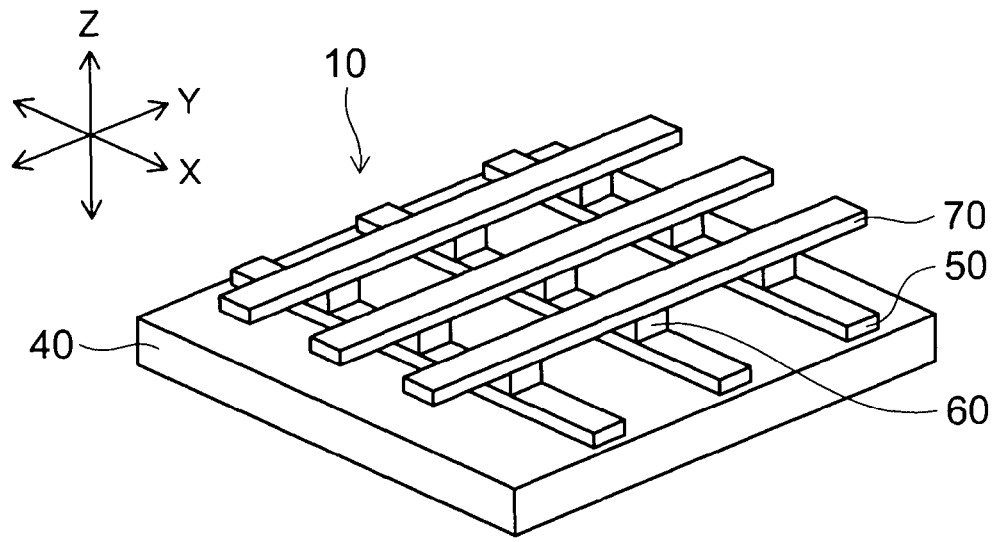
FIG. 2 is a schematic perspective view illustrating an example of a memory cell array.

FIG. 2 is a schematic perspective view illustrating an example of the memory cell array 10.

Figure 3:
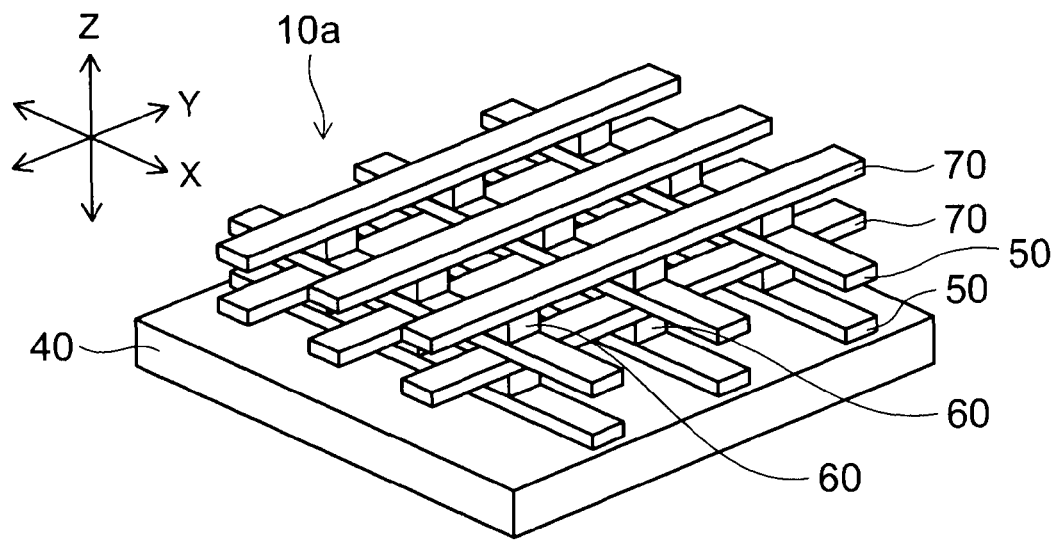
FIGS. 3 and 4 are schematic perspective views illustrating examples of a memory cell array according to other embodiments.
Figure 4:
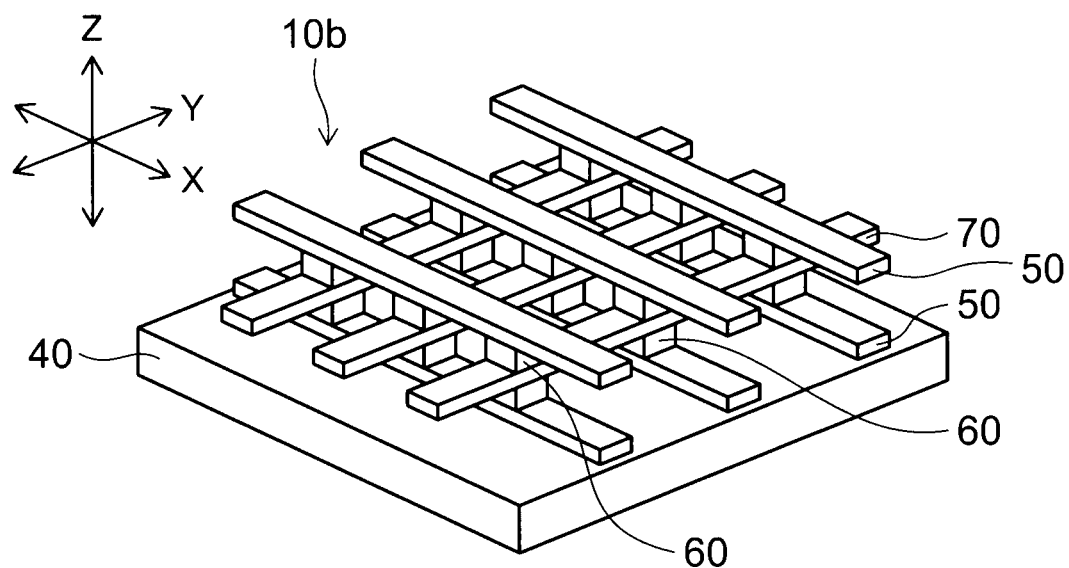

FIGS. 3 and 4 are schematic perspective views illustrating examples of the memory cell array according to other embodiments.

In FIGS. 2 to 4, the insulating layer 66 (see, e.g., FIG. 5) formed around the memory layer 60 is not shown.

As shown in FIG. 1, the nonvolatile semiconductor memory device 1 includes a memory cell array 10, a word line selection circuit 20a, a word line drive circuit 20b, a bit line selection circuit 30a, and a bit line drive circuit 30b.

The memory cell array 10 includes mutually crossing word lines WL (WL1, WL2) and bit lines BL (BL1, BL2), and memory cells 11 (11a-11d) each located at the intersection of the word line WL and the bit line BL.

More specifically, on the major surface of a substrate 40 (see FIG. 5), first interconnects extending in a first direction (e.g., word lines WL extending in the X direction) and second interconnects extending in a second direction non-parallel to the first direction (e.g., bit lines BL extending in the Y direction) are provided. Furthermore, a resistance change layer 63 (see FIG. 5) including a conductive nanomaterial is provided. The resistance change layer 63 is located between the first interconnect and the second interconnect. The resistance change layer 63 can reversibly change between a first resistance state and a second resistance state by a voltage applied or a current supplied through the first interconnect and the second interconnect.

The word lines WL are arranged at a prescribed pitch in the Y direction and formed so as to extend in the X direction. The bit lines BL are arranged at a prescribed pitch in the X direction and formed so as to extend in the Y direction. The memory cells 11 (11a-11d) are arranged in a matrix on a plane formed in the X and Y direction.

Each memory cell 11 includes a diode 12 and a resistance change element 13 connected in series. The diode 12 is provided to prevent sneak current during store (program)/reproduce (read). The resistance change element 13 can be repetitively changed between a low resistance state and a high resistance state by application of voltage or supply of current. Based on the resistance value in these two states, data is stored in a nonvolatile manner. The anode of the diode 12 is connected to the word line WL. The cathode of the diode 12 is connected to one end of the resistance change element 13. The other end of the resistance change element 13 is connected to the bit line BL.

The word line selection circuit 20a includes a plurality of selection transistors 14 (14a, 14b). One end of the selection transistor 14 is connected to one end of the word line WL. The other end of the selection transistor 14 is connected to the word line drive circuit 20b. The gate of the selection transistor 14 is supplied with a signal Sa (Sa1, Sa2). By controlling the signal Sa, the word line WL can be selectively connected to the word line drive circuit 20b.

The word line drive circuit 20b applies to the word line WL a voltage required to erase data stored in the memory cell 11, to program data into the memory cell 11, and to read data out of the memory cell 11. Alternatively, the word line drive circuit 20b supplies the word line WL with a current required to erase data, to program data, and to read data.

The bit line selection circuit 30a includes a plurality of selection transistors 15 (15a, 15b). One end of the selection transistor 15 is connected to one end of the bit line BL. The other end of the selection transistor 15 is connected to the bit line drive circuit 30b. The gate of the selection transistor 15 is supplied with a signal Sb (Sb1, Sb2). By controlling the signal Sb, the bit line BL can be selectively connected to the bit line drive circuit 30b.

The bit line drive circuit 30b applies to the bit line BL a voltage required to erase data stored in the memory cell 11, to program data into the memory cell 11, and to read data out of the memory cell 11. Alternatively, the bit line drive circuit 30b supplies the bit line BL with a current required to erase data, to program data, and to read data. Furthermore, the bit line drive circuit 30b externally outputs the data read through the bit line BL.

Next, the configuration of the memory cell array is illustrated with reference to FIGS. 2 to 4.

As shown in FIG. 2, the memory cell array 10 has a so-called cross-point configuration in which a memory layer 60 is located at the intersection of the word line WL and the bit line BL.

The memory cell array 10 has a configuration in which a first conductive layer 50, a memory layer 60, and a second conductive layer 70 are stacked in this order from bottom to top on the major surface of a substrate 40. Here, the first conductive layer 50 functions as the aforementioned word line WL. The memory layer 60 functions as the aforementioned memory cell 11. The second conductive layer 70 functions as the aforementioned bit line BL.

The first conductive layers 50 are arranged at a prescribed pitch in the Y direction like stripes extending in the X direction. The first conductive layer 50 is formed from a conductive material (such as metal). The first conductive layer 50 is preferably formed from a material having high heat resistance and low electrical resistance. For instance, the first conductive layer 50 can be made of a material such as tungsten (W), titanium (Ti), tantalum (Ta), and nitrides thereof, or a stacked body thereof.

The memory layers 60 are provided on the first conductive layers 50 and arranged in a matrix in the X and Y direction.

The second conductive layers 70 are arranged at a prescribed pitch in the X direction like stripes extending in the Y direction. The second conductive layer 70 is formed in contact with the upper surface of the memory layer 60. The second conductive layer 70 is preferably formed from a material having high heat resistance and low electrical resistance. For instance, the second conductive layer 70 can be made of a material such as tungsten (W), titanium (Ti), tantalum (Ta), and nitrides thereof, or a stacked body thereof. Here, the first conductive layer 50 and the second conductive layer 70 can be formed from the same material, or can be formed from different materials.

The memory cell array 10 illustrated in FIG. 2 includes one first conductive layer 50, one memory layer 60, and one second conductive layer 70. However, the memory cell array 10 is not limited thereto.

For instance, as illustrated in FIG. 3, the memory cell array 10a may have a configuration in which a first conductive layer 50, a memory layer 60, and a second conductive layer 70 are additionally stacked via an insulating layer above (Z direction) the configuration of the aforementioned memory cell array 10.

Alternatively, for instance, as illustrated in FIG. 4, the memory cell array 10b may have a configuration in which a memory layer 60 is formed above (Z direction) the second conductive layer 70 of the aforementioned memory cell array 10, and a first conductive layer 50 is formed above (Z direction) this memory layer 60. That is, like the memory cell array 10b illustrated in FIG. 4, the memory cell array may have a configuration in which the second conductive layer 70 is shared by the overlying and underlying memory layer 60.

Next, the configuration of the memory layer 60 is further illustrated.

Figure 5:
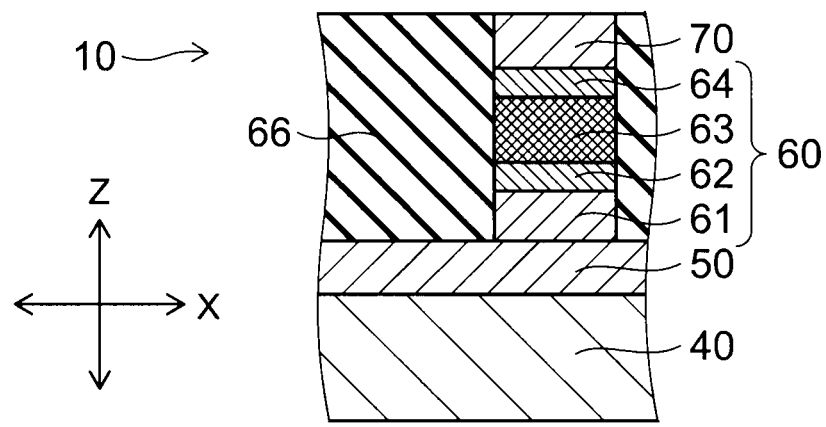
FIG. 5 is a schematic sectional view illustrating the configuration of a memory layer.

FIG. 5 is a schematic sectional view illustrating the configuration of the memory layer 60. Here, FIG. 5 shows a cross section in the memory cell array 10 illustrated in FIG. 2.

As shown in FIG. 5, the memory layer 60 has a configuration in which a diode layer 61, a first electrode layer 62, a resistance change layer 63, and a second electrode layer 64 are stacked in this order from bottom to top in the Z direction.

The diode layer 61 is formed above (Z direction) the first conductive layer 50. The diode layer 61 functions as the aforementioned diode 12. For instance, the diode layer 61 can have a MIM (metal-insulator-metal) structure or PIN ($P^+$-polysilicon-intrinsic-$N^+$-polysilicon) structure.

The first electrode layer 62 is formed above (Z direction) the diode layer 61.

The first electrode layer 62 can be formed from one of at least one or more nitrides and carbides selected from the "compound group g1" listed below. Alternatively, the first electrode layer 62 can be formed from a mixture thereof. That is, the first electrode layer 62 can be formed from a mixture of at least one or more nitrides and carbides selected from the compound group g1.

Compound group g1: Ti—N, Ti—Si—N, Ta—N, Ta—Si—N, Si—N, Ti—C, Ta—C, Si—C, W—N

Alternatively, the first electrode layer 62 can be a stacked body (stacked film) including at least one or more elements selected from the "element group g2" and at least one or more elements selected from the "element group g3" listed below.

Element group g2: hydrogen (H), boron (B), nitrogen (N), silicon (Si), titanium (Ti)

Element group g3: tungsten (W), tantalum (Ta), silicon (Si), iridium (Ir), ruthenium (Ru), gold (Au), platinum (Pt), palladium (Pd), molybdenum (Mo), nickel (Ni), chromium (Cr), cobalt (Co)

The resistance change layer 63 includes a conductive nanomaterial described later, and is formed above (Z direction) the first electrode layer 62. The resistance change layer 63 functions as the aforementioned resistance change element 13. More specifically, the electrical resistance of the resistance change layer 63 has two or more different states, which can be reversibly changed. For instance, by application of voltage to the resistance change layer 63 through the first electrode layer 62 and the second electrode layer 64, the electrical resistance of the resistance change layer 63 is changed from one state to another selected from the two or more states. By way of example, the electrical resistance of the resistance change layer 63 is changed from a low resistance state to a high resistance state, and from the high resistance state to the low resistance state.

Such difference in the state of electrical resistance is associated with binary data ("0" and "1"), for instance, to store and retain data.

The principle of the state change of electrical resistance is not clear. It is attributable to the structural change of the conductive nanomaterial due to application of voltage, such as spacing variation between fine conductors on the nanometer scale, introduction and repair of defects, and change between sp2 bonding and sp3 bonding.

The resistance change layer 63 can include a conductive nanomaterial. By way of example, the resistance change layer 63 can be formed from a conductive nanomaterial. Here, the conductive nanomaterial is a three-dimensional structure made of fine conductors (such as carbon) on the nanometer scale. Examples of the conductive nanomaterial can include carbon nanomaterials such as carbon nanotubes, fullerenes, graphenes, and carbon nanoribbons, and silicon nanomaterials. Furthermore, examples of carbon nanotubes can include single-wall, double-wall, and multi-wall carbon nanotubes. However, the conductive nanomaterial is not limited to those illustrated as long as it is a nanomaterial having electrical conductivity.

The film thickness of the resistance change layer 63 can be e.g. 5 nm (nanometers) or more and 70 nm (nanometers) or less.

The resistance change layer 63 has density varied along a third direction (e.g., Z direction) generally perpendicular to the first direction (e.g., X direction) and the second direction (e.g., Y direction).

The density variation of the resistance change layer 63 will be described later in detail.

The second electrode layer 64 is formed between the upper surface of the resistance change layer 63 and the lower surface of the second conductive layer 70. The second electrode layer 64 can be formed from a material similar to the material of the first electrode layer 62 described above.

The insulating layer 66 is formed between the memory layers 60 arranged in a matrix. The insulating layer 66 functions as a so-called inter-element insulating layer. The insulating layer 66 can be formed from an insulative material. For instance, the insulating layer 66 can be formed from polyimide or phthalocyanine-based organic molecular material.

Next, the configuration of the resistance change layer 63 is further illustrated.

Figure 6A:
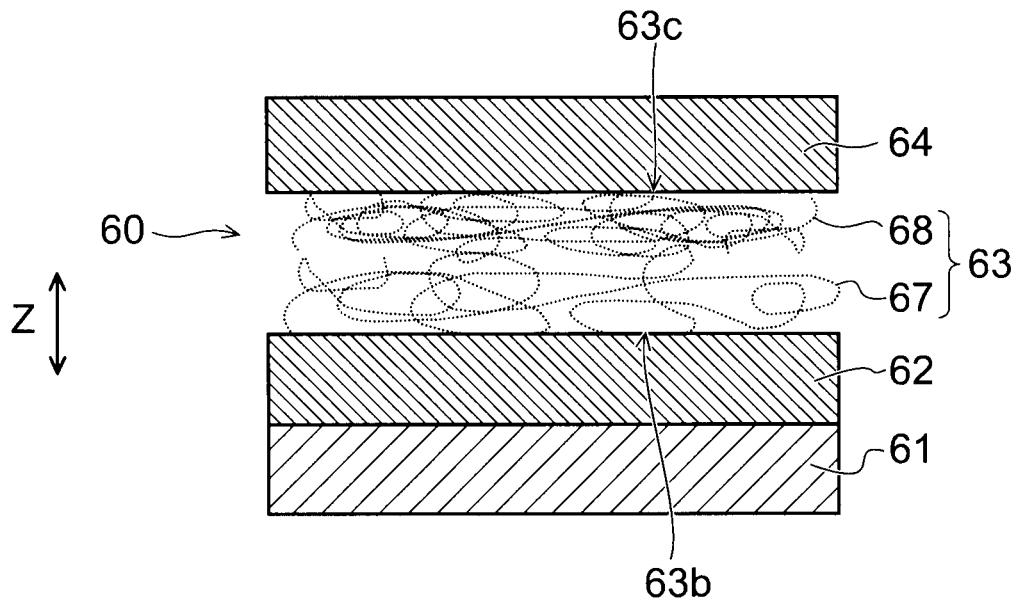
FIGS. 6A and 6B are schematic views illustrating the configuration of a resistance change layer.
Figure 6B:
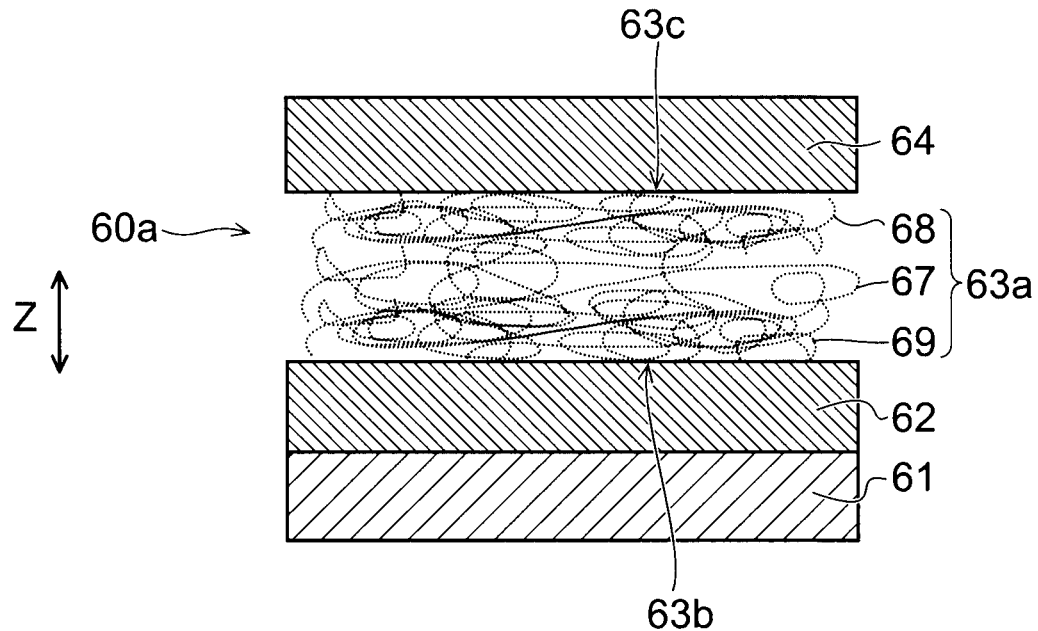

FIGS. 6A and 6B are schematic views illustrating the configuration of the resistance change layer.

As described above, the memory layer 60 has a configuration in which a diode layer 61, a first electrode layer 62, a resistance change layer 63, and a second electrode layer 64 are stacked in this order from bottom to top in the Z direction.

Here, the resistance change layer including the conductive nanomaterial (e.g., carbon nanomaterial) is a three-dimensional structure on the nanometer scale. Hence, the density (packing factor), or the fraction of volume that is occupied by atoms, decreases by 25-75% in terms of packing factor as compared with the film formed from multinary metal oxides. As a result, interstices occur in the resistance change layer including the conductive nanomaterial. Such interstices exist in the resistance change layer including any conductive nanomaterial. For instance, such interstices exist in the resistance change layer including any of the carbon nanomaterials such as single-wall, double-wall, and multi-wall carbon nanotubes, and fullerenes. With the increase of the molecular structure of the conductive nanomaterial, the close packing factor tends to decrease.

In such cases, if the second electrode layer 64 is formed above the low-density resistance change layer, the material of the second electrode layer 64 penetrates into the interstices more easily. In particular, if the second electrode layer 64 is formed by the CVD (chemical vapor deposition) method, the material of the second electrode layer 64 penetrates into the interstices more significantly. Then, if the material of the second electrode layer 64 penetrated into the interstices is in contact with the first electrode layer 62, the second electrode layer 64 is electrically connected to the first electrode layer 62 to cause short circuit. This interferes with the normal operation of the memory cell (memory layer 60).

As a method for suppressing this short circuit, thickening of the resistance change layer may be contemplated. However, increase in the film thickness dimension involves disadvantages of longer processing time and higher difficulty in microfabrication due to increased aspect ratio.

On the other hand, if the density of the resistance change layer is increased, the material of the second electrode layer 64 penetrates into the interstices less easily, and hence short circuit can be suppressed. However, simply increasing the density of the resistance change layer causes another problem of degrading the switching characteristics (characteristics regarding switching between the low resistance state and the high resistance state).

Thus, in this embodiment, instead of the resistance change layer having uniform density in the film thickness direction (Z direction), the resistance change layer is provided with density varied in the film thickness direction (Z direction) to suppress short circuit and suppress degradation of switching characteristics.

For instance, as shown in FIG. 6A, the density of the resistance change layer is increased on the side of the electrode formed after formation of the resistance change layer (in the case illustrated in FIG. 6A, on the second electrode layer 64 side). In the case shown in FIG. 6A, the density of the resistance change layer 68 is made higher than the density of the resistance change layer 67.

That is, the resistance change layer 63 has a first end portion 63b on the substrate 40 side in the third direction (film thickness direction, Z direction) and a second end portion 63c opposite from the first end portion 63b. The density on the second end portion 63c side is made higher than the density of the central portion in the third direction (film thickness direction, Z direction).

In this case, for instance, the density on the second end portion 63c side can be made three times or more the density of the central portion in the third direction (film thickness direction, Z direction). In the case shown in FIG. 6A, the density (packing factor) of the resistance change layer 68 can be made three times or more the density (packing factor) of the resistance change layer 67. For instance, the packing factor of the resistance change layer 68 can be set to approximately 75%, and the packing factor of the resistance change layer 67 can be set to approximately 25%.

Thus, the high-density resistance change layer 68 can suppress that the material of the second electrode layer 64 penetrates into the interstices of the resistance change layer. This can suppress short circuit between the second electrode layer 64 and the first electrode layer 62. Furthermore, the low-density resistance change layer 67 can suppress degradation of switching characteristics.

Furthermore, because of being less prone to short circuit, the thickness dimension of the resistance change layer can be thinned by that amount. This can facilitate increasing the integration density of the nonvolatile semiconductor memory device.

Furthermore, because the interstices between the conductive nanomaterials are made small, the contact area between the resistance change layer 68 and the second electrode layer 64 can be increased. This can increase adhesiveness between the resistance change layer 68 and the second electrode layer 64. Furthermore, this can reduce contact resistance between the resistance change layer 68 and the second electrode layer 64.

Furthermore, as shown in FIG. 6B, the density of the resistance change layer can be increased also on the side of the electrode formed before formation of the resistance change layer (in the case illustrated in FIG. 6B, on the first electrode layer 62 side). In the case shown in FIG. 6B, the density of the resistance change layer 69 can be made higher than the density of the resistance change layer 67.

That is, the density on the first end portion 63b side can be made higher than the density of the central portion in the third direction (film thickness direction, Z direction).

In this case, for instance, the density on the first end portion 63b side can be made three times or more the density of the central portion in the third direction (film thickness direction, Z direction). In the case shown in FIG. 6B, the density (packing factor) of the resistance change layer 69 can be made three times or more the density (packing factor) of the resistance change layer 67. For instance, the packing factor of the resistance change layer 69 can be set to approximately 75%, and the packing factor of the resistance change layer 67 can be set to approximately 25%.

Thus, the high-density resistance change layer 69 can suppress that the material of the second electrode layer 64 penetrated into the interstices reaches the first electrode layer 62. Hence, short circuit between the second electrode layer 64 and the first electrode layer 62 can be suppressed more reliably. Furthermore, the low-density resistance change layer 67 can suppress degradation of switching characteristics.

Furthermore, because of being less prone to short circuit, the thickness dimension of the resistance change layer can be further thinned. This can further facilitate increasing the integration density of the nonvolatile semiconductor memory device. Furthermore, as in the aforementioned case of the resistance change layer 68 and the second electrode layer 64, the contact area between the resistance change layer 69 and the first electrode layer 62 can be increased. This can increase adhesiveness between the resistance change layer 69 and the first electrode layer 62. Furthermore, this can reduce contact resistance between the resistance change layer 69 and the first electrode layer 62.

In FIGS. 6A and 6B, layers with different densities are provided. However, the embodiment is not limited thereto. For instance, the density may be varied stepwise or gradually.

Next, the operation of the nonvolatile semiconductor memory device 1, i.e., the execution of program operation, read operation, and erase operation on the memory cell 11, is illustrated.

By way of example, in the case illustrated below, the memory cell 11a shown in FIG. 1 is selected, and various operations are performed on the memory cell 11a. The memory cell 11a is applied with a prescribed voltage and subjected to the program operation and erase operation.

First, the program operation (set operation) is illustrated.

In the program operation, the potential of the selected word line WL1 is set relatively higher than the potential of the selected bit line BL1. For instance, if the bit line BL1 is placed at the ground potential, the word line WL1 can be applied with a positive potential.

When a prescribed voltage is applied to the memory cell 11a thus selected, a potential gradient occurs in the memory cell 11a, and a current pulse flows therein. By this current pulse, the electrical resistance of the resistance change element 13 changes from the high resistance state to the low resistance state.

Furthermore, the pulse width of the voltage applied to the word line WL1 in this program operation is made longer than the pulse width of the voltage applied in the erase operation. That is, in the program operation, the word line WL1 is applied with voltage for a longer period of time than in the erase operation.

In the program operation, preferably, the non-selected word line WL2 and the non-selected bit line BL2 are all biased at the same potential. Furthermore, in the standby time before the program operation, preferably, all the word lines WL1, WL2 and all the bit lines BL1, BL2 are precharged.

Next, the erase operation (reset operation) is illustrated.

In the erase operation, the potential of the selected word line WL1 is set relatively higher than the potential of the selected bit line BL1. For instance, if the bit line BL1 is placed at the ground potential, the word line WL1 can be applied with a positive potential.

When a high current pulse flows in the memory cell 11a thus selected, the erase operation is performed by the Joule heat generated thereby and the residual heat. Alternatively, the erase operation is performed by the application voltage resulting from the aforementioned high current pulse or the current energy itself. In this erase operation, the electrical resistance of the resistance change element 13 changes from the low resistance state to the high resistance state.

Furthermore, as described above, the pulse width of the voltage applied to the word line WL1 in this erase operation is made shorter than the pulse width of the voltage applied in the program operation. That is, in the erase operation, the word line WL1 is applied with voltage for a shorter period of time than in the program operation.

Thus, by using different pulse widths in the erase operation and in the program operation, the erase operation and the program operation can be separately performed.

Next, the read operation is illustrated.

In the read operation, a current pulse (read current pulse) is applied from the selected bit line BL1 to the selected memory cell 11a. In the bit line drive circuit 30b, the current from the bit line BL1 is read out, and the electrical resistance of the memory cell 11a is measured. Thus, the read operation is performed. Here, the current pulse (read current pulse) applied to the memory cell 11a is set to such a small value as to cause no change in the resistance state of the resistance change layer constituting the memory cell 11a.

In the nonvolatile semiconductor memory device 1 according to this embodiment, the high-density portion (e.g., resistance change layer 68) can suppress that the material of the electrode formed after formation of the resistance change layer (in the case illustrated in FIGS. 6A and 6B, the second electrode layer 64) penetrates into the interstices of the resistance change layer. Furthermore, the low-density portion (e.g., resistance change layer 67) can suppress degradation of switching characteristics. Furthermore, the contact area between the high-density portion (e.g., resistance change layer 68) and the second electrode layer 64 can be increased. This can increase adhesiveness between the resistance change layer and the second electrode layer 64, and reduce contact resistance between the resistance change layer and the second electrode layer 64. Hence, the operation of the nonvolatile semiconductor memory device 1 can be stabilized.

Furthermore, in the case of increasing also the density on the first end portion 63b side (e.g., in the case of providing the resistance change layer 69), the contact area between the high-density portion (e.g., resistance change layer 69) and the first electrode layer 62 can be increased. This can increase adhesiveness between the resistance change layer and the first electrode layer 62, and reduce contact resistance between the resistance change layer and the first electrode layer 62.

Furthermore, because of being less prone to short circuit, the thickness dimension of the resistance change layer can be thinned by that amount. This can facilitate increasing the integration density of the nonvolatile semiconductor memory device.

Next, a method for manufacturing the nonvolatile semiconductor memory device 1 according to this embodiment is illustrated. By way of example, a method for manufacturing the nonvolatile semiconductor memory device 1 including the memory cell array 10 illustrated in FIG. 2 is illustrated.

FIGS. 7A to 7F are schematic process sectional views illustrating the method for manufacturing the nonvolatile semiconductor memory device 1.

First, as shown in FIG. 7A, a first conductive layer 50, a diode layer 61, a first electrode layer 62, a resistance change layer 63, a second electrode layer 64, a stopper layer 72, and an etching mask 90 are formed in this order from bottom on the major surface of a substrate 40. That is, the layers are stacked in a direction (Z-axis direction) generally perpendicular to a first direction (X-axis direction) and a second direction (Y-axis direction) to form a stacked body. Here, the etching mask 90 includes an opening 90a extending in the first direction (X-axis direction).

Here, the first conductive layer 50, the diode layer 61, the first electrode layer 62, the second electrode layer 64, the stopper layer 72, and the second conductive layer 70 can be formed by such methods as the sputtering method and CVD (chemical vapor deposition) method (such as thermal CVD and plasma CVD method), for instance.

In this case, if the second electrode layer 64 is formed by the CVD method, the material of the second electrode layer 64 penetrates more easily into the interstices of the resistance change layer 63. Hence, it is preferable to use the sputtering method to form the second electrode layer 64.

Formation of the resistance change layer 63 will be described later in detail.

Next, as shown in FIG. 7B, the stacked body (in which the layers from the first conductive layer 50 to the etching mask 90 are stacked) is etched to form a device isolation region 80. That is, etching is performed through the opening 90a of the etching mask 90 to form a first device isolation region 80 in the stacked body. The etching is performed to the depth of the interface of the substrate 40 and the first conductive layer 50.

Next, as shown in FIG. 7C, a first insulating layer 66b is formed by e.g. the plasma CVD (chemical vapor deposition) method on the surface of the stacked body including the device isolation region 80. The raw material gas can be e.g. $SiH_4/O_2$. Thus, an insulating layer with less impurity and high quality can be formed on the sidewall including the side surface of the resistance change layer 63 and the diode layer 61.

The first insulating layer 66b is formed on the surface of the device isolation region 80 and the major surface of the etching mask 90. Thus, a trench 80a is formed in and around the device isolation region 80.

Next, as shown in FIG. 7D, a second insulating layer 66c is formed by e.g. the spin coating method on the surface of the first insulating layer 66b. The coating material used in this process can be e.g. polysilazane. The second insulating layer 66c is formed by filling the trench 80a with the coating material. Thus, the device isolation region 80 is filled with the first insulating layer 66b and the second insulating layer 66c. That is, an insulating layer 66 is formed in the device isolation region 80. Thus, the insulating layer 66 is formed in the first direction (X-axis direction).

Next, as shown in FIG. 7E, the upper surface of the stacked body is planarized by e.g. the CMP (chemical mechanical polishing) method. The planarization is performed until the stopper layer 72 is eliminated. That is, the second electrode layer 64 is exposed by planarizing the major surface of the stacked body in which the material of the insulating layer 66 is deposited. Here, in the case of integrating the stopper layer 72 with the second conductive layer 70, the end point of the planarization can be set to the point when the stopper layer 72 is exposed.

Next, as shown in FIG. 7F, a second conductive layer 70 and an etching mask 90 are formed in this order from bottom on the upper surface of the stacked body. Here, the etching mask 90 includes an opening 90b extending in the second direction (Y-axis direction).

Then, like the foregoing, a device isolation region 80 and an insulating layer 66 are formed and planarized.

More specifically, first, etching is performed through the opening 90b of the etching mask 90 to form a device isolation region 80. The etching is performed to the depth of the interface of the second electrode layer 64 and the second conductive layer 70. Next, an insulating layer 66 is formed by the spin coating method and the like. Then, the upper surface of the stacked body is planarized by e.g. the CMP method to expose the second conductive layer 70.

As described above, the first conductive layer 50 constituting word lines WL, the diode layer 61, the first electrode layer 62, the resistance change layer 63, the second electrode layer 64, and the second conductive layer 70 constituting bit lines BL are processed into a desired shape. Here, a memory cell array having a stacked structure as illustrated in FIGS. 3 and 4 can be formed by repeating a similar procedure.

Next, formation of the resistance change layer is further illustrated.

Figure 8A:
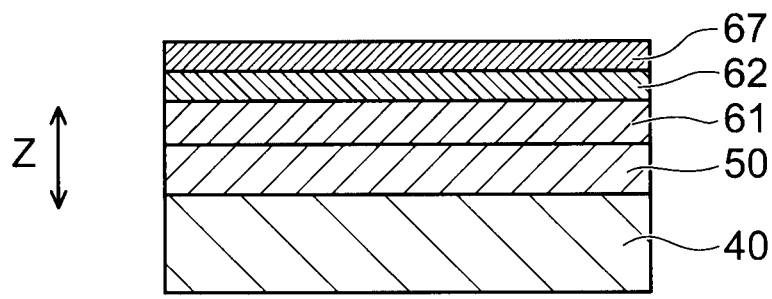
FIGS. 8A to 8C are schematic process sectional views illustrating the formation of the resistance change layer.
Figure 8B:
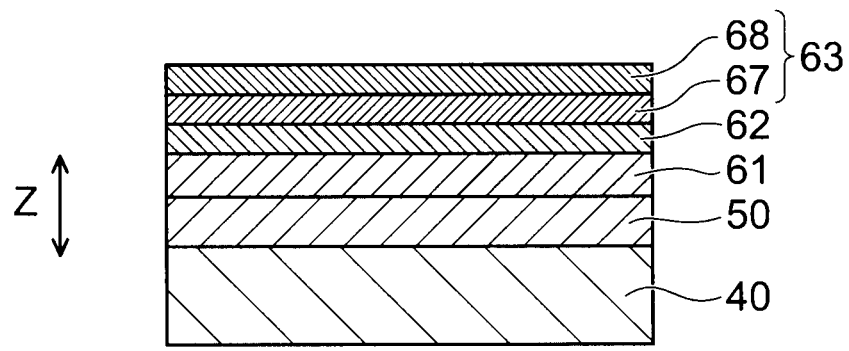
Figure 8C:
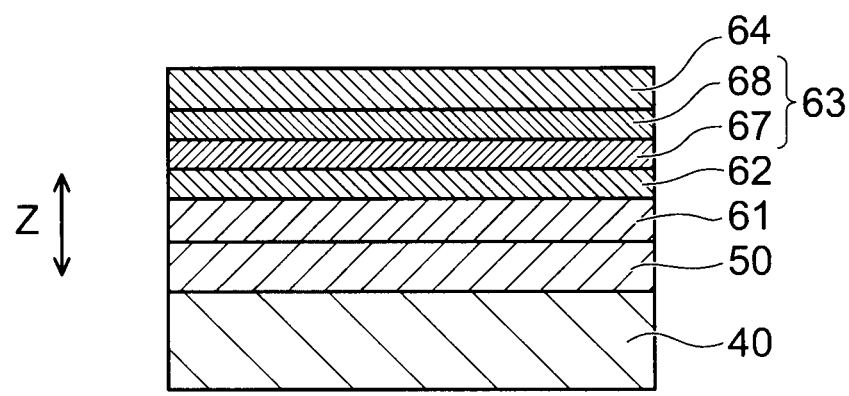

FIGS. 8A to 8C are schematic process sectional views illustrating the formation of the resistance change layer.

Here, FIGS. 8A to 8C show the case of forming the resistance change layer 63 illustrated in FIG. 6A.

First, as shown in FIG. 8A, as described above, a first conductive layer 50, a diode layer 61, and a first electrode layer 62 are formed in this order from bottom on the major surface of a substrate 40. A resistance change layer 67 is stacked on the surface of the first electrode layer 62.

For instance, a dispersion liquid in which a conductive nanomaterial is dispersed in water or alcohol is supplied to the surface of the first electrode layer 62 and dried. Thus, the resistance change layer 67 can be formed. In this case, the dispersion liquid can be supplied by using various methods such as the spray method, ink jet method, and spin coating method. The drying can be performed using a baking furnace.

Next, as shown in FIG. 8B, a resistance change layer 68 having higher density than the resistance change layer 67 is stacked on the surface of the resistance change layer 67. By stacking the resistance change layer 68 on the surface of the resistance change layer 67, a resistance change layer 63 is formed.

The method for forming the resistance change layer 68 can be made similar to the method for forming the resistance change layer 67. More specifically, a dispersion liquid in which a conductive nanomaterial is dispersed in water or alcohol is supplied to the surface of the resistance change layer 67 and dried. Thus, the resistance change layer 68 can be formed. In this case, the dispersion liquid can be supplied by using various methods such as the spray method, ink jet method, and spin coating method. The drying can be performed using a baking furnace.

In this case, the density of the formed resistance change layer can be controlled by the dispersion concentration of the conductive nanomaterial in the dispersion liquid. More specifically, the dispersion concentration of the dispersion liquid used to form the resistance change layer 68 is made higher than the dispersion concentration of the dispersion liquid used to form the resistance change layer 67. Thus, the density of the formed resistance change layer 68 can be made higher than the density of the resistance change layer 67.

For instance, the dispersion concentration of the dispersion liquid used to form the resistance change layer 67 can be set to approximately 0.5% by weight. The dispersion concentration of the dispersion liquid used to form the resistance change layer 68 can be set to approximately 2% by weight.

Furthermore, the density of the formed resistance change layer can be controlled also by the dimension of the conductive nanomaterial in the dispersion liquid. For instance, the density of the formed resistance change layer can be increased by decreasing the cross-sectional dimension (e.g., diameter dimension), or shortening the length dimension, of the conductive nanomaterial.

For instance, in the case where the conductive nanomaterial is made of carbon nanotubes, the diameter dimension of the carbon nanotube used to form the resistance change layer 67 can be set to approximately 10 nm (nanometers), and the length dimension thereof can be set to approximately 500 nm (nanometers). The diameter dimension of the carbon nanotube used to form the resistance change layer 68 can be set to approximately 2 nm (nanometers), and the length dimension thereof can be set to approximately 100 nm (nanometers).

Furthermore, the density of the formed resistance change layer can be controlled also by the thickness dimension of the layer of the supplied dispersion liquid.

According to the findings obtained by the inventors, in the case where a dispersion liquid is supplied and dried to form a resistance change layer, the density of the formed resistance change layer can be increased by decreasing the thickness dimension of the layer of the supplied dispersion liquid.

Figure 9A:
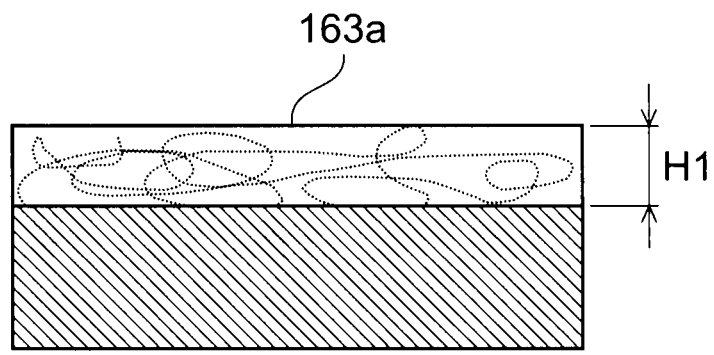
FIGS. 9A and 9B are schematic views illustrating the relationship between the thickness dimension of the layer of the dispersion liquid and the density of the formed resistance change layer.
Figure 9B:
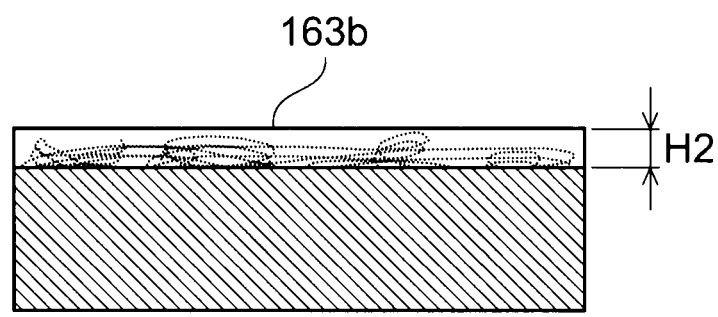

FIGS. 9A and 9B are schematic views illustrating the relationship between the thickness dimension of the layer of the dispersion liquid and the density of the formed resistance change layer.

As shown in FIG. 9A, in the case where the thickness dimension H1 of the layer of the dispersion liquid 163a is large, the density of the formed resistance change layer is low. In contrast, as shown in FIG. 9B, in the case where the thickness dimension H2 of the layer of the dispersion liquid 163b is small, the density of the formed resistance change layer is high.

In the case where the thickness dimension H1 of the layer of the dispersion liquid 163a is large, the solvent is removed in the state in which the conductive nanomaterial is expanded. Hence, it is considered that the density of the formed resistance change layer is made low. In contrast, in the case where the thickness dimension H2 of the layer of the dispersion liquid 163b is small, the solvent is removed in the state in which the conductive nanomaterial is flattened. Hence, it is considered that the density of the formed resistance change layer is made high.

In this case, a resistance change layer with high density and small thickness dimension is formed. However, by repeating the supplying and drying of the dispersion liquid, the thickness of the high-density resistance change layer can be adjusted to a desired dimension. Furthermore, by repeating the supplying and drying of the dispersion liquid, the conductive nanomaterial in the dispersion liquid subsequently supplied penetrates into the interstices of the resistance change layer previously formed. This further increases the density of the formed resistance change layer.

As illustrated above, in forming the resistance change layer 67, the thickness dimension of the layer of the supplied dispersion liquid can be increased so that a resistance change layer 67 with low density can be formed. On the other hand, in forming the resistance change layer 68, the thickness dimension of the layer of the supplied dispersion liquid can be decreased, and the supplying and drying of the dispersion liquid can be repeated as needed. Thus, a resistance change layer 68 with high density and desired thickness dimension can be formed.

Next, as shown in FIG. 8C, a second electrode layer 64 is stacked on the surface of the resistance change layer 68.

In this case, if the second electrode layer 64 is formed by the CVD method, the material of the second electrode layer 64 penetrates more easily into the interstices of the resistance change layer 63. Hence, it is preferable to use the sputtering method to form the second electrode layer 64.

FIGS. 10A to 10D are also schematic process sectional views illustrating the formation of the resistance change layer.

Here, FIGS. 10A to 10D show the case of forming the resistance change layer 63a illustrated in FIG. 6B.

Figure 10A:
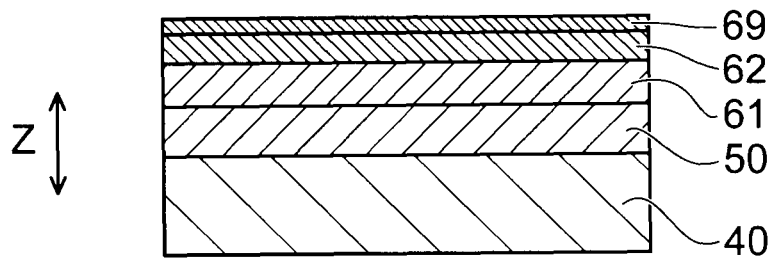
FIGS. 10A to 10D are schematic process sectional views illustrating the formation of the resistance change layer.

First, as shown in FIG. 10A, as described above, a first conductive layer 50, a diode layer 61, and a first electrode layer 62 are formed in this order from bottom on the major surface of a substrate 40. A resistance change layer 69 having lower density than the resistance change layer 67 to be subsequently formed is stacked on the surface of the first electrode layer 62.

Figure 10B:
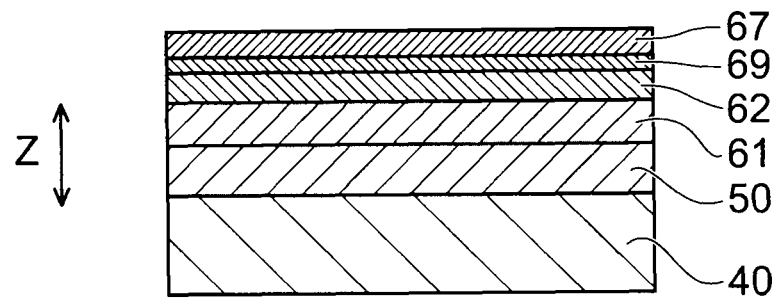

Next, as shown in FIG. 10B, a resistance change layer 67 having lower density than the resistance change layer 69 is stacked on the surface of the resistance change layer 69.

Figure 10C:
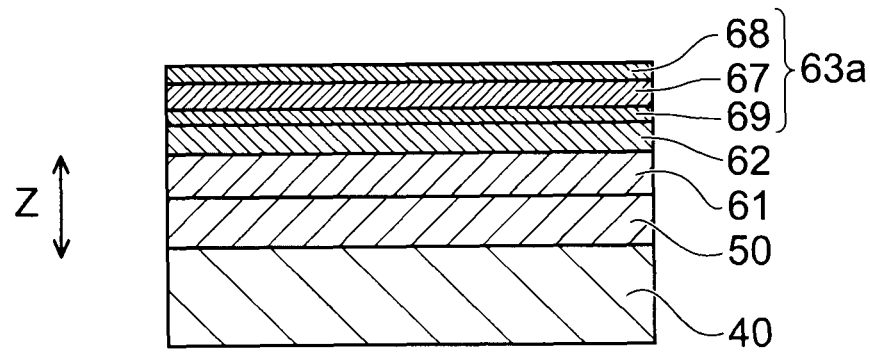

Next, as shown in FIG. 10C, a resistance change layer 68 having higher density than the resistance change layer 67 is stacked on the surface of the resistance change layer 67. By stacking the resistance change layer 68 on the surface of the resistance change layer 67, a resistance change layer 63a is formed.

Figure 10D:
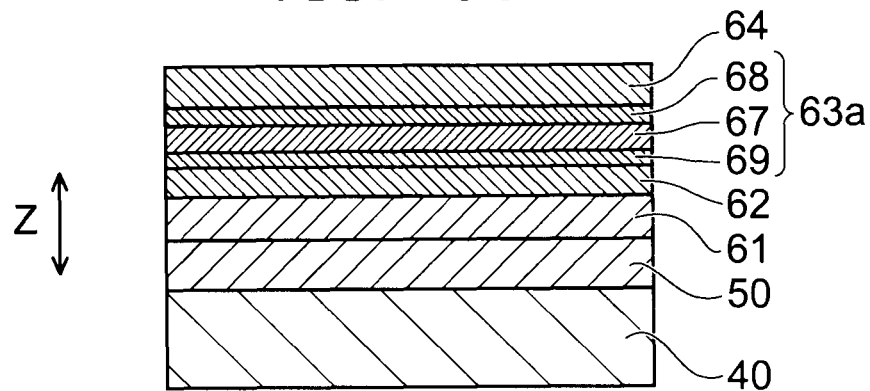

Next, as shown in FIG. 10D, a second electrode layer 64 is stacked on the surface of the resistance change layer 68.

In this case, if the second electrode layer 64 is formed by the CVD method, the material of the second electrode layer 64 penetrates more easily into the interstices of the resistance change layer 63a. Hence, it is preferable to use the sputtering method to form the second electrode layer 64.

The method for forming the resistance change layer 67, the resistance change layer 68, and the resistance change layer 69 and the method for controlling the density thereof can be made similar to those described above, and hence the detailed description thereof is omitted.

The density of the formed resistance change layer can be varied by controlling the dispersion concentration of the conductive nanomaterial in the dispersion liquid, the dimension of the conductive nanomaterial in the dispersion liquid, and the thickness dimension of the layer of the supplied dispersion liquid. These may be used alone or in combination as appropriate.

Furthermore, a resistance change layer including layers with different densities as illustrated in FIGS. 6A and 6B may be formed. Alternatively, a resistance change layer with the density varied stepwise or gradually may be formed. In this case, the step of forming a resistance change layer can be performed a plurality of times so that the density is varied stepwise or gradually.

As illustrated above, the method for manufacturing a nonvolatile semiconductor memory device according to this embodiment includes the step of forming a resistance change layer. In this step, the density is varied in the third direction (e.g., Z direction) generally perpendicular to the first direction (e.g., X direction) and the second direction (e.g., Y direction).

In the step of forming a resistance change layer, a dispersion liquid with a conductive nanomaterial dispersed therein is supplied and dried to form a resistance change layer.

In the step of forming a resistance change layer, the density is varied by at least one selected from the group consisting of the dispersion concentration of the conductive nanomaterial in the dispersion liquid, the dimension of the conductive nanomaterial in the dispersion liquid, and the thickness dimension of the layer of the supplied dispersion liquid.

The formed resistance change layer has a first end portion 63b on the substrate 40 side in the third direction (e.g., Z direction) and a second end portion 63c opposite from the first end portion 63b. In the step of forming a resistance change layer, the density on the second end portion 63c side is made higher than the density of the central portion in the third direction (e.g., Z direction).

Furthermore, in the step of forming a resistance change layer, the density on the first end portion 63b side is made higher than the density of the central portion in the third direction (e.g., Z direction).

In the method for manufacturing a nonvolatile semiconductor memory device according to this embodiment, the high-density portion (e.g., resistance change layer 68) can suppress that the material of the electrode formed after formation of the resistance change layer (in the case illustrated in FIGS. 8A to 8C and 10A to 10D, the second electrode layer 64) penetrates into the interstices of the resistance change layer. This can suppress short circuit between the second electrode layer 64 and the first electrode layer 62. Furthermore, the low-density portion (e.g., resistance change layer 67) can suppress degradation of switching characteristics. Furthermore, the contact area between the high-density portion (e.g., resistance change layer 68) and the second electrode layer 64 can be increased. This can increase adhesiveness between the resistance change layer and the second electrode layer 64, and reduce contact resistance between the resistance change layer and the second electrode layer 64.

Furthermore, in the case of increasing also the density on the first end portion 63b side (e.g., in the case of providing the resistance change layer 69), the contact area between the high-density portion (e.g., resistance change layer 69) and the first electrode layer 62 can be increased. This can increase adhesiveness between the resistance change layer and the first electrode layer 62, and reduce contact resistance between the resistance change layer and the first electrode layer 62.

Furthermore, because of being less prone to short circuit, the thickness dimension of the resistance change layer can be thinned by that amount. This can facilitate increasing the integration density of the nonvolatile semiconductor memory device.

Thus, the yield and productivity can be improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

For instance, the shape, dimension, number, material, and layout of the components of the nonvolatile semiconductor memory device 1 are not limited to those illustrated, but may be suitably modified.

In the above examples, the memory layer 60 includes a diode layer 61. However, the embodiments are not limited thereto. For instance, the diode layer 61 can be omitted if the resistance change layer 63 changes its electrical resistance depending on the application direction of voltage.

In the memory layer 60 of the above examples, the second electrode layer 64 is provided on the upper surface of the resistance change layer 63. However, the embodiments are not limited thereto. For instance, if the resistance change layer 63 changes its resistance by the Joule heat, a heater layer can be provided between the resistance change layer 63 and the second electrode layer 64. In this case, the heater layer can be a layer generating heat by application of voltage.

In the case of providing a heater layer, the high-density portion (e.g., resistance change layer 68) can suppress that the material of the heater layer penetrates into the interstices of the resistance change layer.

What is claimed is:
1. A nonvolatile semiconductor memory device comprising:
a first interconnect extending in a first direction on a major surface of a substrate;

a second interconnect extending in a second direction non-parallel to the first direction; and a resistance change layer including a conductive nanomaterial, the resistance change layer located between the first interconnect and the second interconnect and being capable of reversibly changing between a first resistance state and a second resistance state by a voltage applied or a current supplied through the first interconnect and the second interconnect, the resistance change layer having a density of the conductive nanomaterial varied along a third direction generally perpendicular to the first direction and the second direction, the resistance change layer having a first end portion on a side of the substrate in the third direction and a second end portion opposite from the first end portion, and the density of the conductive nanomaterial on a side of the second end portion being higher than the density of the conductive nanomaterial of a central portion in the third direction.

2. The device according to claim 1, wherein in the resistance change layer, the density of the conductive nanomaterial on a side of the first end portion is higher than the density of the conductive nanomaterial of the central portion in the third direction.

3. The device according to claim 1, wherein in the resistance change layer, the density of the conductive nanomaterial of the second end portion is three times or more higher than the density of the conductive nanomaterial of the central portion in the third direction.

4. The device according to claim 1, wherein in the resistance change layer, the density of the conductive nanomaterial of the first end portion is three times or more higher than the density of the conductive nanomaterial of the central portion in the third direction.

5. The device according to claim 1, wherein in the resistance change layer, the density of the conductive nanomaterial is varied stepwise along the third direction.

6. The device according to claim 1, wherein in the resistance change layer, the density of the conductive nanomaterial is varied gradually along the third direction.

7. The device according to claim 1, wherein the resistance change layer includes an interstice.

8. The device according to claim 1, wherein the resistance change layer includes at least one of a carbon nanomaterial and a silicon nanomaterial.

9. The device according to claim 1, wherein the resistance change layer has a thickness of 5 nm or more and 70 nm or less.

10. The device according to claim 1, wherein the conductive nanomaterial is a carbon nanomaterial.

11. The device according to claim 10, wherein the carbon nanomaterial is carbon nanotube or fullerene.

\* \* \* \* \*